(12) United States Patent
Chang et al.

(10) Patent No.: US 12,550,449 B2
(45) Date of Patent: Feb. 10, 2026

(54) ELECTROSTATIC DISCHARGE PROTECTION CIRCUIT WITH DIODE STRING

(71) Applicant: TAIWAN SEMICONDUCTOR MANUFACTURING COMPANY, LTD., Hsinchu (TW)

(72) Inventors: Pin-Hsin Chang, Hsinchu (TW); Tzu-Heng Chang, Hsinchu (TW); Hsin-Yu Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 407 days.

(21) Appl. No.: 18/346,740

(22) Filed: Jul. 3, 2023

(65) Prior Publication Data

US 2025/0015072 A1    Jan. 9, 2025

(51) Int. Cl.
*H10D 89/60* (2025.01)
*H02H 9/04* (2006.01)
*H10D 84/01* (2025.01)
*H10D 84/03* (2025.01)

(52) U.S. Cl.
CPC ........... *H10D 89/611* (2025.01); *H02H 9/046* (2013.01); *H10D 84/0112* (2025.01); *H10D 84/038* (2025.01); *H10D 89/921* (2025.01); *H10D 89/713* (2025.01); *H10D 89/911* (2025.01)

(58) Field of Classification Search
None
See application file for complete search history.

(56) References Cited

U.S. PATENT DOCUMENTS

| | | | |
|---|---|---|---|
| 2010/0176375 A1* | 7/2010 | Lochtefeld | H01L 21/02636 257/655 |
| 2013/0207224 A1* | 8/2013 | Park | H10D 8/00 257/487 |
| 2014/0159207 A1* | 6/2014 | Domanski | H10D 89/711 257/565 |

* cited by examiner

*Primary Examiner* — Bilkis Jahan
(74) *Attorney, Agent, or Firm* — Hauptman Ham, LLP

(57) ABSTRACT

An integrated circuit includes a first horizontal conductor and a second horizontal conductor. The integrated circuit includes a first diode between a first first-type block and a first second-type block, a second diode between a second first-type block and a second second-type block, and a third diode between a third first-type block and a third second-type block. The first first-type block and the first second-type block are aligned along a first column. The second first-type block and the second second-type block are aligned along a second column. The third first-type block and the third second-type block are aligned along a third column. The second first-type block is connected to the first second-type block through the second horizontal conductor. The third first-type block is conductively connected to the second second-type block through the first horizontal conductor.

20 Claims, 12 Drawing Sheets

ELECTROSTATIC DISCHARGE PROTECTION CIRCUIT WITH DIODE STRING

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
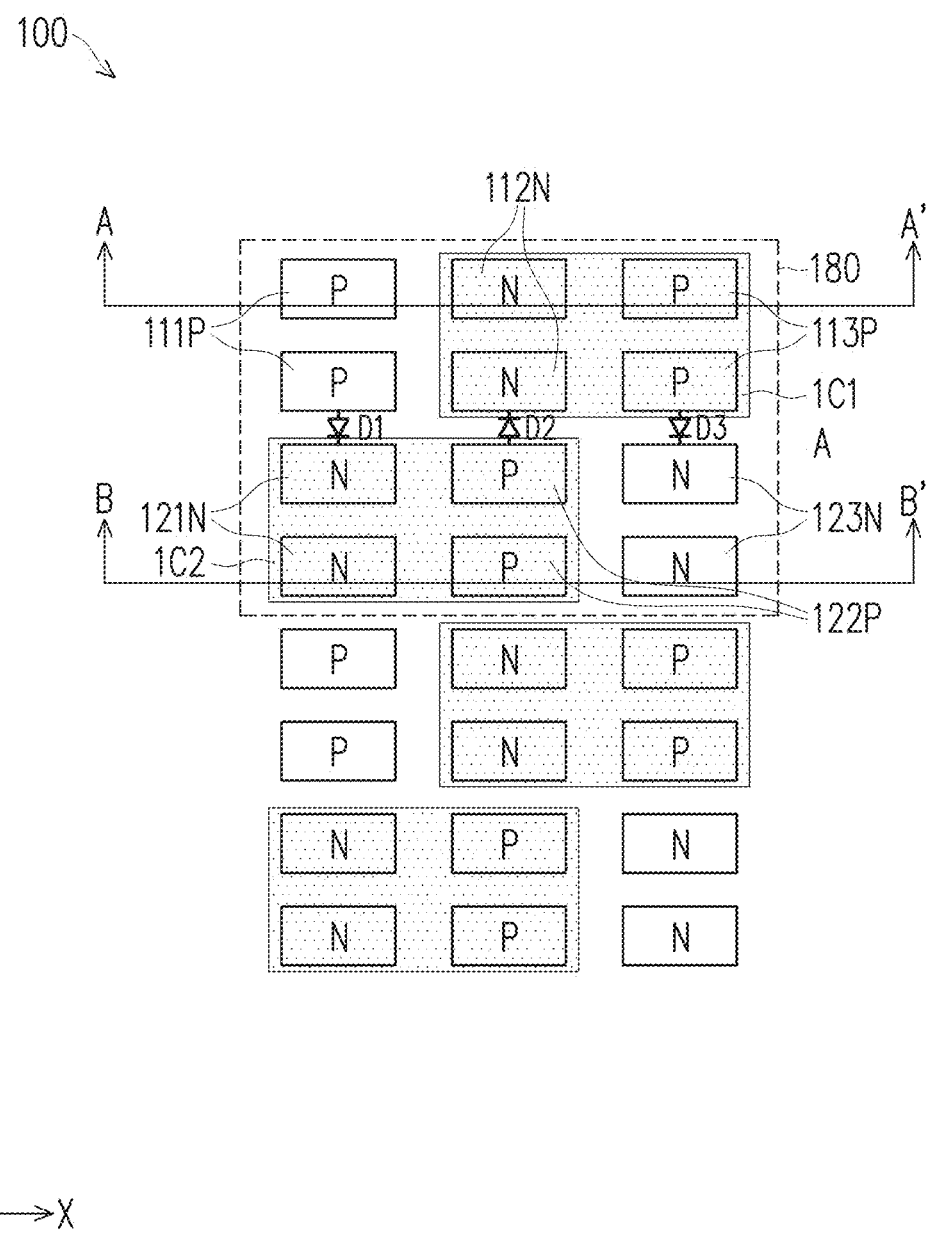
FIG. 1A is a layout diagram of a diode string in an ESD protection circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an electrostatic discharge ("ESD") protection circuit includes a diode string connected to an input pad of an integrated circuit. The diode string includes multiple diodes connected in series. Each diode in the diode string is formed between a p-type block and an n-type block. In some embodiments, a p-type block is formed with one or more heavily doped p-type regions, and an n-type block is formed with one or more heavily doped n-type regions. The p-type blocks and the n-type blocks for forming the multiple diodes are arranged in a matrix. The p-type blocks and the n-type blocks are alternatively positioned along a first direction (such as along a row of the matrix), and the conductive connection between two serially connected diodes in the diode string is formed with a conductor extending along the first direction that connects the n-type block of one diode and the p-type block of another diode. The conductive connection between two serially connected diodes in the diode string has reduced resistance, as compared with some alternative implementations in which the blocks for forming the diode string are arranged a matrix that has identical type of blocks (such as only p-type blocks or only n-type block) positioned along the first direction. The reduced resistance in the diode string improves the ESD protection of the input pad of the integrated circuit by the diode string.

In some embodiments, one or more SCR ("Silicon Controlled Rectifier") devices are formed with additional p-type blocks and/or additional n-type blocks arranged in the matrix, and the SCR devices are connected in parallel with the diode string. The combination of the SCR devices and the diode string enhances the ESD protection of the input pad of the integrated circuit.

FIG. 1A is a layout diagram of a diode string in an ESD protection circuit, in accordance with some embodiments. In FIG. 1A, the ESD protection circuit 100 includes p-type blocks and n-type blocks arranged in a matrix. The matrix includes p-type block 111P, n-type block 112N, and p-type block 113P arranged in a first row along the X-direction. The matrix includes n-type block 121N, p-type block 122P, and n-type block 113N arranged in a second row along the X-direction. The p-type block 111P and the n-type block 121N are aligned along the Y-direction in the first column. The n-type block 112N and the p-type block 122P are aligned along the Y-direction in the second column. The p-type block 113P and the n-type block 123N are aligned along the Y-direction in the third column. The Y-direction is perpendicular to the X-direction.

A first diode D1 is formed between the p-type block 111P and the n-type block 121N. A second diode D2 is formed between the n-type block 112N and the p-type block 122P. A third diode D3 is formed between the p-type block 113P and the n-type block 123N. The n-type block 121N of the first diode D1 and the p-type block 122P of the second diode D2 are conductively connected together with a horizontal conductor 1C2 extending in the X-direction. The n-type block 112N of the second diode D2 and the p-type block 113P of the third diode D3 are conductively connected together with a horizontal conductor 1C1 extending in the X-direction. Consequently, the first diode D1, the second diode D2, and the third diode D3 are connected in series between the p-type block 111P and the n-type block 123N as a diode string 180.

Figure 1B:
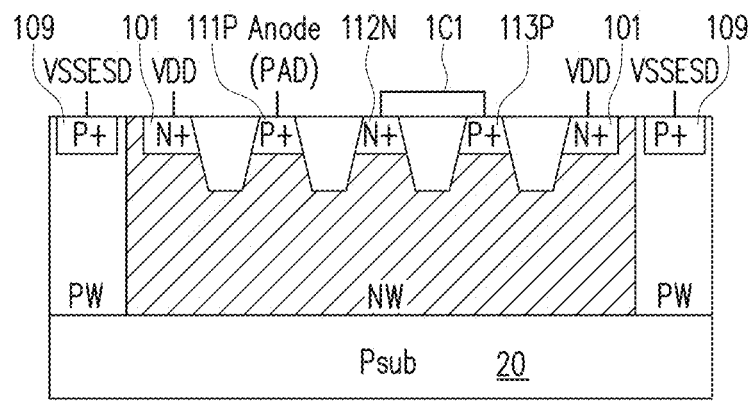
FIGS. 1B-1C are cross-sectional views of the ESD protection circuit of FIG. 1A, in accordance with some embodiments.

FIG. 1B is a cross-sectional view of the ESD protection circuit 100 in the cutting plane A-A' of FIG. 1A, in accordance with some embodiments. In FIG. 1B, each of the p-type block 111P and the p-type block 113P is implemented as heavily doped p-type regions "P+" in a corresponding n-type well "NW" of the substrate 20, and the n-type block 112N is implemented as heavily doped n-type region "N+" in corresponding n-type well "NW" of the substrate 20. The horizontal conductor 1C1 conductively connects the n-type block 112N of the second diode D2 with the p-type block 113P of the third diode D3. The n-type well "NW" is connected to an upper supply voltage VDD through the heavily doped n-type region 101. The p-type well "PW" is connected to a lower supply voltage VSSESD through the heavily doped p-type region 109.

Figure 1C:
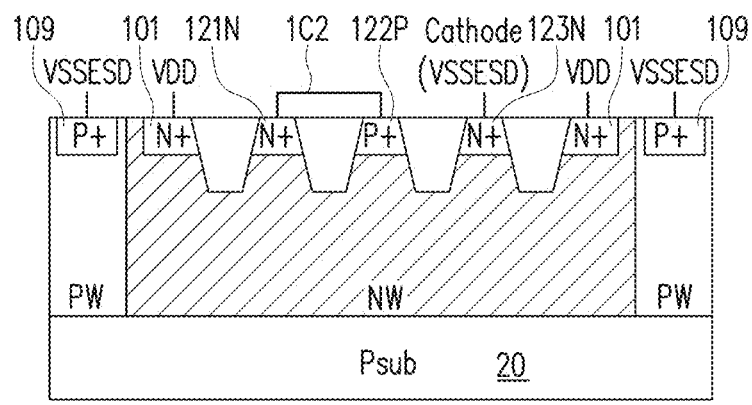

FIG. 1C is a cross-sectional view of the ESD protection circuit 100 in the cutting plane B-B' of FIG. 1A, in accordance with some embodiments. In FIG. 1C, each of the n-type block 121N and the n-type block 123N is implemented as heavily doped n-type regions "N+" in a corresponding n-type well "NW" of the substrate 20, and the p-type block 122P is implemented as heavily doped p-type region "P+" in a corresponding n-type well "NW" of the substrate 20. The horizontal conductor 1C2 conductively connects the n-type block 121N of the first diode D1 with the p-type block 122P of the second diode D2. The n-type well "NW" is connected to an upper supply voltage VDD through the heavily doped n-type region 101. The p-type well "PW" is connected to a lower supply voltage VSSESD through the heavily doped p-type region 109.

Figure 1D:
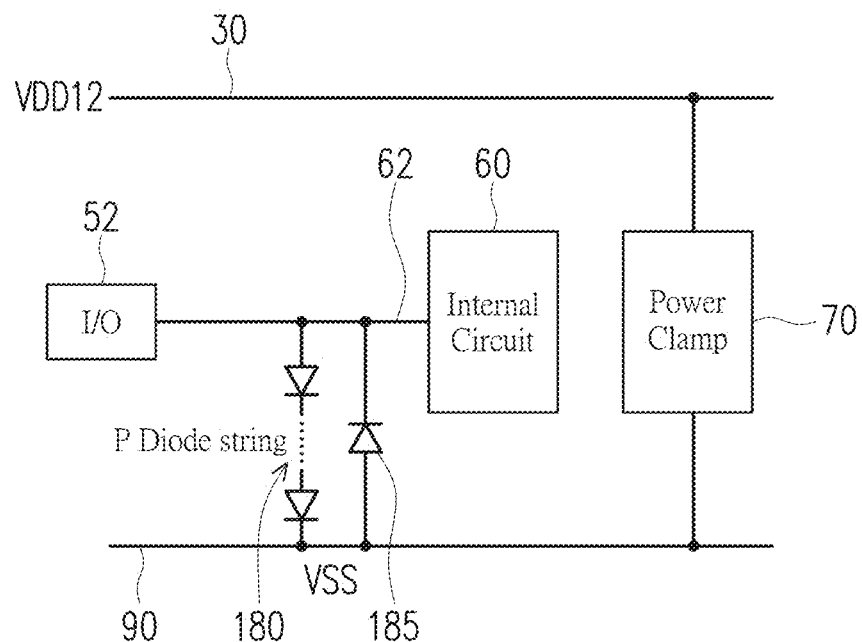
FIG. 1D is a circuit diagram of an ESD protection circuit having a diode string connected to an input pad of an integrated circuit, in accordance with some embodiments.
Figure 1E:
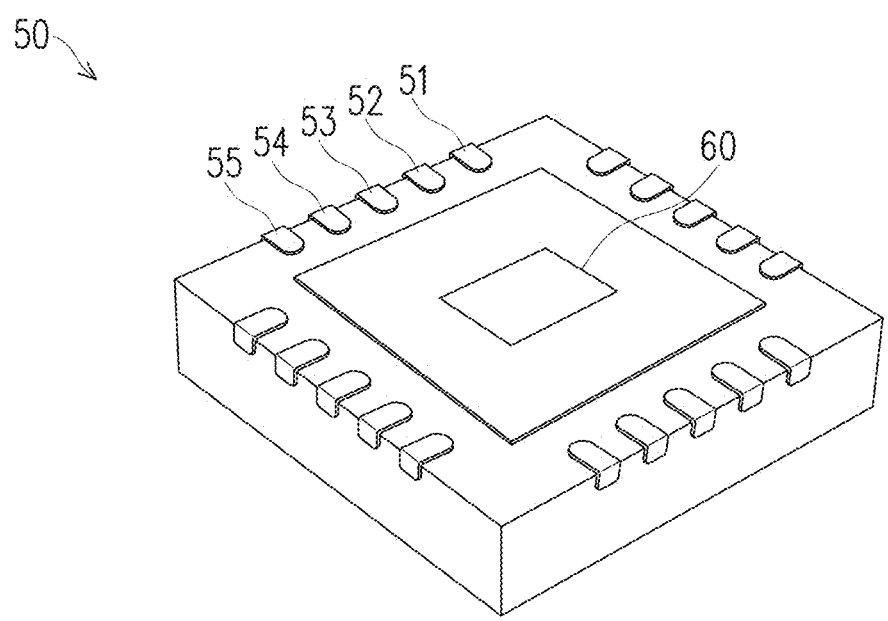
FIG. 1E is a schematic diagram of an integrated circuit device having connection pads near the edges of the device.

The diode string 180 in FIG. 1A is constructed as an electrostatic discharge ("ESD") protection device. FIG. 1D is a circuit diagram of an ESD protection circuit having a diode string connected to an input pad of an integrated circuit, in accordance with some embodiments. FIG. 1E is a schematic diagram of an integrated circuit device having connection pads near the edges of the device.

In FIG. 1D, the diode string 180 is connected between an input pad 52 and a lower power supply VSS. The input pad 52 is connected to an input node 62 of an internal circuit 60. In the example of FIG. 1A, the p-type electrode of the diode string 180 is the p-type block 111P, and the p-type block 111P is connected to the input pad 52. In addition to the diode string 180, another diode 185 is connected between the input pad 52 of the internal circuit 60 and the lower power supply VSS. The diode string 180 and the diode 185 are inversely connected in parallel. In normal operation, the diode string 180 is forward biased, while the diode 185 is reverse biased. The input pad 52 is one of the connection pads 51-55 which are at the peripheral areas of an integrated circuit device 50 as shown in FIG. 1E. In FIGS. 1D-1E, the input pad 52 is configured to receive input signals from circuits outside of the integrated circuit device 50 and configured to transmit the input signals received at the input pad 52 to the input node 62 of an internal circuit 60.

In the layout diagram of FIG. 1A, in each row of the matrix, the p-type blocks and the n-type blocks are posited along the X-direction in alternation. For example, in the first row, the n-type block 112N is positioned between the p-type blocks 111P and 113P. In the second row, the p-type block 122P is positioned between the n-type blocks 121N and 123N. When the p-type blocks and the n-type blocks are posited in alternation, the resistance in the conductors between two adjacent diodes in the diode string 180 is reduced, as compared with some other implementations in which each row includes only p-type blocks or only n-type blocks. Because of the reduced resistance in the conductors, the residue resistance of the diode string 180 is reduced when the diode string 180 is at the conducting state under a forward bias, which results in an improvement of the ESD current protected by the diode string 180.

Some modifications of the ESD protection circuit 100 in FIG. 1A is within the contemplated scope of the preset disclosure. For example, a diode string includes first-type blocks and second-type blocks. In the example implementations of FIG. 1A, each p-type block is implemented as a first-type block, and each n-type block is implemented as a second-type block. In some modified implementations, each n-type block is implemented as a first-type block, and each p-type block is implemented as a second-type block. The modification includes substituting each p-type block in FIG. 1A with a newly created n-type block and substituting each n-type block in FIG. 1A with a newly created p-type block.

Figure 2A:
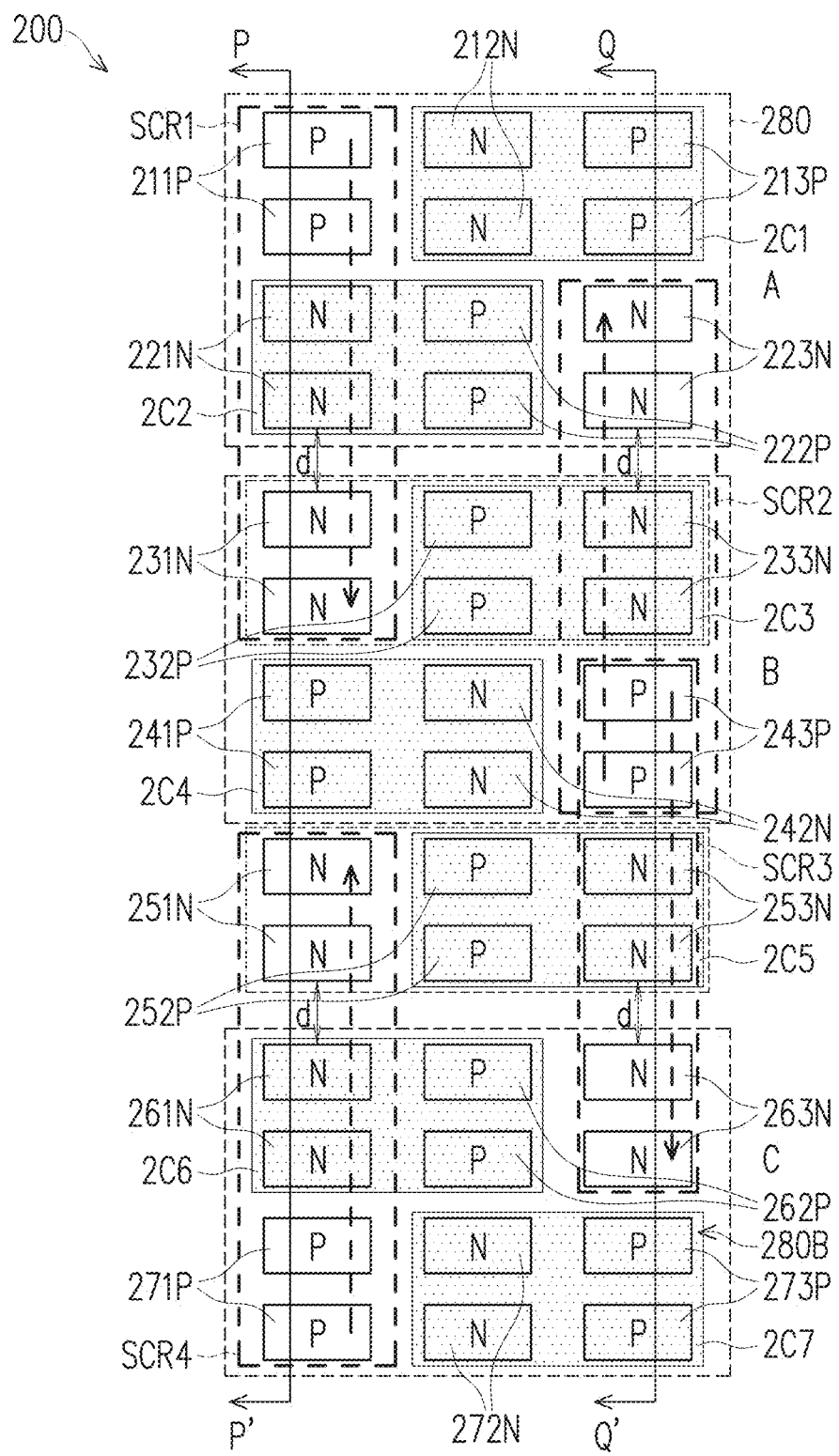
FIG. 2A is a layout diagram of diode strings in an ESD protection circuit having additional SCR devices, in accordance with some embodiments.
Figure 2B:
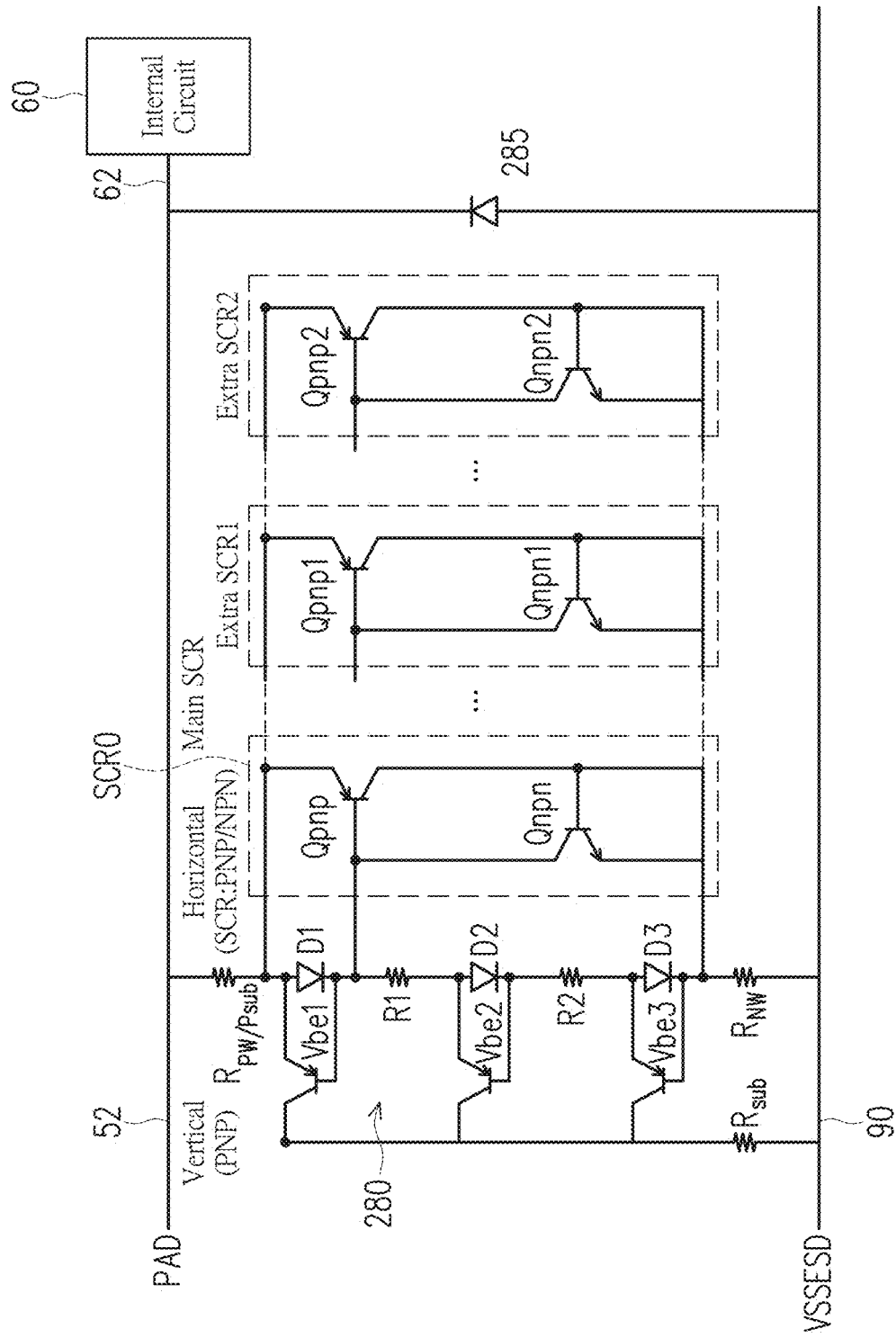
FIG. 2B is a circuit diagram of an ESD protection circuit having a diode string connected to an input pad of an integrated circuit, in accordance with some embodiments.
Figure 2C:
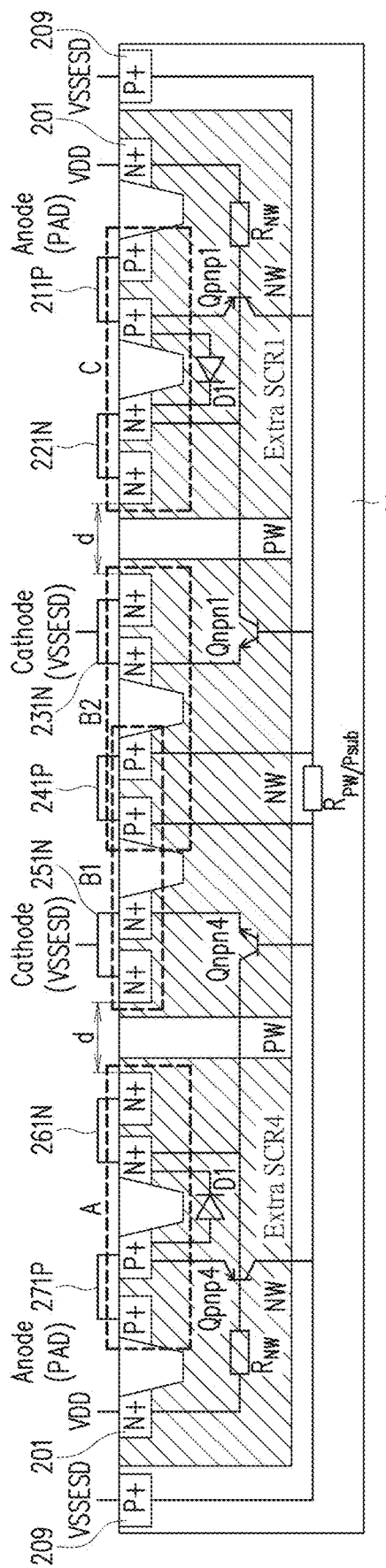
FIGS. 2C-2D are cross-sectional views of an integrated circuit in various cutting planes as specified in the layout diagram of FIG. 2A, in accordance with some embodiments.
Figure 2D:
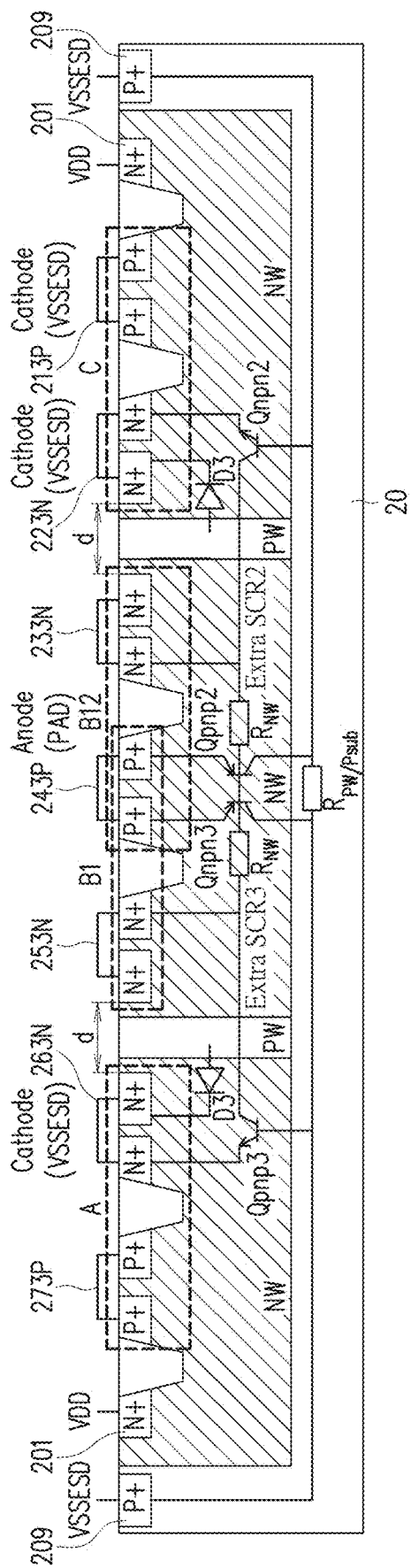

In some embodiments, the ESD protection of an input pad with a diode string is improved with additional SCR ("Silicon Controlled Rectifier") devices. FIG. 2A is a layout diagram of diode strings in an ESD protection circuit having additional SCR devices, in accordance with some embodiments. FIG. 2B is a circuit diagram of an ESD protection circuit having a diode string connected to an input pad of an integrated circuit, in accordance with some embodiments. FIGS. 2C-2D are cross-sectional views of an integrated circuit in various cutting planes as specified in the layout diagram of FIG. 2A, in accordance with some embodiments.

In FIG. 2A, the ESD protection circuit 200 includes p-type blocks and n-type blocks arranged in a matrix. The matrix includes p-type block 211P, n-type block 212N, and p-type block 213P arranged in a first row along the X-direction. The matrix includes n-type block 221N, p-type block 222P, and n-type block 213N arranged in a second row along the X-direction. The p-type block 211P and the n-type block 221N are aligned along the Y-direction in the first column. The n-type block 212N and the p-type block 222P are aligned along the Y-direction in the second column. The p-type block 213P and the n-type block 223N are aligned along the Y-direction in the third column.

A first diode D1 is formed between the p-type block 211P and the n-type block 221N. A second diode D2 is formed between the n-type block 212N and the p-type block 222P. A third diode D3 is formed between the p-type block 213P and the n-type block 223N. The n-type block 221N of the first diode D1 and the p-type block 222P of the second diode D2 are conductively connected together with a horizontal conductor 2C2 extending in the X-direction. The n-type block 212N of the second diode D2 and the p-type block 213P of the third diode D3 are conductively connected together with a horizontal conductor 2C1 extending in the X-direction. Consequently, the first diode D1, the second diode D2, and the third diode D3 are connected in series between the p-type block 211P and the n-type block 223N as a diode string 280. The diode string 280 is constructed as a electrostatic discharges ("ESD") protection device. As shown in FIG. 2B, the diode string 280 is connected between the input pad 52 and the lower power supply VSSESD. The input pad 52 is connected to an input node 62 of an internal circuit 60. In addition to the diode string 280, another diode 285 is connected between the input pad 52 and the lower power supply VSSESD.

In FIG. 2A, while two rows of p-type blocks and n-type blocks (i.e., the first row and the second row) are used to implement the diodes D1, D2, and D3, four rows of p-type blocks and n-type blocks (i.e., the first row, the second row, the third row, and the fourth row) are used to implement additional SCR devices. The p-type blocks and n-type blocks in the third row of the matrix include n-type block 231N, p-type block 232P, and n-type block 233N aligned along the X-direction. The p-type blocks and n-type blocks in the fourth row of the matrix include p-type block 241P, n-type block 242N, and p-type block 243P aligned along the X-direction.

The p-type block 211P, the n-type block 221N, the n-type block 231N, and the p-type block 241P are aligned along the Y-direction in the first column. The n-type block 212N, the p-type block 222P, the p-type block 232P, and the n-type block 242N are aligned along the Y-direction in the second column. The p-type block 213P, the n-type block 223N, the n-type block 233N, and the p-type block 243P are aligned along the Y-direction in the third column. The p-type block 211P, the n-type block 221N, and the n-type block 231N form a first SCR device SCR1 in the first column. The n-type block 223N, the n-type block 233N, and the p-type block 243P form a second SCR device SCR2 in the third column.

In the circuit diagram FIG. 2B, the diode string 280 and the diode 285 are inversely connected in parallel between the input pad 52 and the power supply VSSESD. In normal operation, the diode string 280 is forward biased, while the diode 285 is reverse biased. The input pad 52 is connected to the input node 62 of the internal circuit 60. Additionally, the first SCR device SCR1 (which is formed the p-type block 211P, the n-type block 221N, and the n-type block 231N in FIG. 2A) and the second SCR device SCR2 (which is formed the n-type block 223N, the n-type block 233N, and the p-type block 243P in FIG. 2A) are also connected in parallel between the input pad 52 and the lower power supply VSSESD. In the circuit diagram of FIG. 2B, the main SCR device SCR0 connected between the input pad 52 and the lower power supply VSSESD is formed horizontally by the p-type blocks and n-type blocks in the first row and the second row.

In some embodiments, each of the diodes D1, D2, and D3 is formed with a corresponding n-well in a p-type substrate, and each of the diodes D1, D2, and D3 is associated with a corresponding Bipolar Junction Transistor (BJT) (such as Vbe1, Vbe2, or Vbe3). The collectors of the Bipolar Junction Transistors Vbe1, Vbe2, and Vbe3 are at the p-type substrate. The base of each of the Bipolar Junction Transistors Vbe1, Vbe2, and Vbe3 is at the n-well associated with the corresponding diode D1, D2, or D3. The emitter of each of the Bipolar Junction Transistors Vbe1, Vbe2, and Vbe3 is at the p-type electrode of the corresponding diode D1, D2, or D3.

The resistance between the lower power supply VSSESD and the collectors of the Bipolar Junction Transistors Vbe1, Vbe2, and Vbe3 is modeled with a substrate resistor Rsub. The conductive connection from the n-type block 221N of the first diode D1 to the p-type block 222P of the second diode D2 through the horizontal conductor 2C2 (in FIG. 2A) is modeled with a resistor R1. The conductive connection from the n-type block 212N of the second diode D2 to the p-type block 213P of the third diode D3 through the horizontal conductor 2C1 (in FIG. 2A) is modeled with a resistor R2. The resistance values of the resistors R1 and R2 are both reduced, as compared with some other implementations in which each row includes only p-type blocks or only n-type blocks.

FIG. 2C is a cross-sectional view of the ESD protection circuit 200 of FIG. 2A in the cutting plane P-P', in accordance with some embodiments. In FIG. 2C, each of the p-type block 211P and the p-type block 241P is implemented as heavily doped p-type regions "P+" in a corresponding n-type well "NW" of the substrate 20, and each of the n-type block 221N and the n-type block 231N is implemented as heavily doped n-type regions "N+" in a corresponding n-type well "NW" of the substrate 20. The diode D1 is formed between the p-type block 211P and the n-type block 221N. The p-type block 211P is connected to an input pad (e.g., the input pad 52 in FIG. 2A), and the n-type block 231N is connected to the lower supply voltage VSSESD. The first SCR device SCR1 between the p-type block 211P and the n-type block 231N is formed with a p-n-p transistor Qpnp1 and a n-p-n transistor Qnpn1.

The p-n-p transistor Qpnp1 in the first SCR device SCR1 has the emitter formed at the p-type block 211P, the base formed at the n-type well surrounding the p-type block 211P, and the collector formed at the substrate 20. The n-type electrode of the diode D1 is connected to the base of the p-n-p transistor Qpnp1, because the heavily doped n-type regions "N+" for the n-type block 221N is in omics contact with the n-type well "NW" surrounding the n-type block 221N. The n-type well "NW" surrounding the n-type block 221N is connected to an upper supply voltage VDD through the heavily doped n-type region 201. The conductive connection between the base of the p-n-p transistor Qpnp1 and the upper supply voltage VDD is modeled with a resistor $R_{NW}$. The substrate 20 is connected to the lower supply voltage VSSESD through the substrate contact 209 which is a heavily doped p-type region "P+".

The n-p-n transistor Qnpn1 in the first SCR device SCR1 has the emitter formed at the n-type block 231N, the base formed at the substrate 20, and the collector formed at a p-type well "PW" which is connected to the base of the p-n-p transistor Qpnp1 in the first SCR device SCR1. The base of the n-p-n transistor Qnpn1 is conductively connected to the collector of the p-n-p transistor Qpnp1.

FIG. 2D is a cross-sectional view of the ESD protection circuit 200 of FIG. 2A in the cutting plane Q-Q', in accordance with some embodiments. In FIG. 2D, each of the p-type block 213P and the p-type block 243P is implemented as heavily doped p-type regions "P+" in a corresponding n-type well "NW" of the substrate 20, and each of the n-type block 223N and the n-type block 233N is implemented as heavily doped n-type regions "N+" in corresponding n-type well "NW" of the substrate 20. The diode D3 is formed between the p-type block 213P and the n-type block 223N. The p-type block 243P is connected to an input pad (e.g., the input pad 52 in FIG. 2B), and the n-type block 223N is connected to the lower supply voltage VSSESD. The second SCR device SCR2 between the p-type block 243P and the n-type block 223N is formed with a p-n-p transistor Qpnp2 and an n-p-n transistor Qnpn2.

The p-n-p transistor Qpnp2 in the second SCR device SCR2 has the emitter formed at the p-type block 243P, the base formed at the n-type well surrounding the p-type block 243P, and the collector formed at the substrate 20.

The n-p-n transistor Qnpn2 in the second SCR device SCR2 has the emitter formed at the n-type block 223N, the base formed at the substrate 20, and the collector formed at an p-type well "PW" which is connected to the n-type block 223N. The conductive connection from the n-type block 223N to the base of the p-n-p transistor Qpnp2 is modeled with a resistor $R_{NW}$. The base of the n-p-n transistor Qnpn2 is conductively connected to the collector of the p-n-p transistor Qpnp2.

In FIG. 2A, the diodes D1, D2, and D3 are formed with the p-type blocks and the n-type blocks in the first row and the second row, while the SCR devices SCR1 and SCR2 are formed with the p-type blocks and the n-type blocks in the first row, the second row, the third row, and the fourth row. In some embodiments, another diode string having supplementary diodes D1', D2', and D3' is formed with the p-type blocks and the n-type blocks in the third row and the fourth row.

A first supplementary diode D1' is formed between the p-type block 243P in the fourth row and the n-type block 233N in the third row. A second supplementary diode D2' is formed between the n-type block 232P in the third row and the n-type block 242N in the fourth row. A third supplementary diode D3' is formed is formed between the p-type block 241P in the fourth row and the n-type block 231N in the third row.

The n-type block 233N of the first supplementary diode D1' and the p-type block 232P of the second supplementary diode D2' are conductively connected together with a horizontal conductor 2C3 in the third row extending in the X-direction. The n-type block 242N of the second supplementary diode D2' and the p-type block 241P of the third supplementary diode D3' are conductively connected together with a horizontal conductor 2C4 in the fourth row extending in the X-direction. Consequently, the first supplementary diode D1', the second supplementary diode D2', and the third supplementary diode D3' are connected in series between the p-type block 243P and the n-type block 231N as a supplementary diode string 280'. In some embodiments, when the p-type block 243P is connected to the input pad 52 in FIG. 2B and the n-type block 223N is connected to the lower supply voltage VSSESD, the supplementary diode string 280' is connected in parallel with the supplementary diode string 280 between the input pad 52 and the lower supply voltage VSSESD, whereby larger ESD current at the input pad 52 becomes protectable by the ESD protection circuit 200.

In some embodiments, the ESD protection circuit 200 further includes a fifth row, a six row, and a seventh row of p-type blocks and n-type blocks. Additional SCR devices and diode strings are formed with the p-type blocks and the n-type blocks in the fifth row, the six row, and the seventh row in combination with the p-type blocks and the n-type blocks in the fourth row.

The fifth row includes n-type block 251N, p-type block 252P, and n-type block 253N aligned along the X-direction. The sixth row includes n-type block 261N, p-type block 262P, and n-type block 263N aligned along the X-direction. The seventh row includes p-type block 271P, n-type block 272N, and p-type block 273P aligned along the X-direction. The n-type block 251N, the n-type block 261N, and the p-type block 271P are aligned with the p-type block 241P along the Y-direction in the first column. The p-type block 252P, the p-type block 262P, and the n-type block 272N are aligned with the n-type block 242N along the Y-direction in the second column. The n-type block 253N, the n-type block 263N, and the p-type block 273P are aligned with the p-type block 243P along the Y-direction in the third column.

When the n-type block 263N in the sixth row is connected to the lower supply voltage VSSESD and the p-type block 243P in the fourth row is connected to an input pad (such as the input pad 52 in FIG. 2B), additional ESD protection for the input pad is provided by the SCR device SCR3 formed with the p-type block 243P, the n-type block 253N, and the n-type block 263N in the third column.

In some embodiments, a diode string 280B between the p-type block 271P and the n-type block 263N is formed with the p-type blocks and the n-type blocks in the six row and the seventh row. The diode string 280B includes a first diode between the p-type block 271P and the n-type block 261N, a second diode between the p-type block 262P and the n-type block 272N, and a third diode between the p-type block 273P and the n-type block 263N. The n-type block 261N of the first diode is conductively connected to the p-type block 262P of the second diode through a horizontal conductor 2C6 aligned with the n-type block 261N and the p-type block 262P in the sixth row. The n-type block 272N of the second diode is conductively connected to the p-type block 273P of the third diode through a horizontal conductor 2C7 aligned with the n-type block 272N and the p-type block 273P in the seventh row.

When the n-type block 263N in the sixth row is connected to the lower supply voltage VSSESD and the p-type block 271P in the seventh row is connected to an input pad (such as the input pad 52 in FIG. 2B), additional ESD protection for the input pad is provided by the diode string 280B between the p-type block 271P and the n-type block 263N.

In some embodiments, when the n-type block 251N in the fifth row is connected to the lower supply voltage VSSESD and the p-type block 271P in the seventh row is connected to an input pad (such as the input pad 52 in FIG. 2B), additional ESD protection for the input pad is provided by the SCR device SCR4 formed with the p-type block 271P, the n-type block 261N, the n-type block 251N in the first column.

In some embodiments, a supplementary diode string 280'B between the p-type block 243P and the n-type block 251N is formed with the p-type blocks and the n-type blocks in the fourth row and the fifth row. The supplementary diode string 280'B includes a first supplementary diode between the p-type block 243P and the n-type block 253N, a second supplementary diode between the p-type block 252P and the n-type block 242N, and a third supplementary diode between the p-type block 241P and the n-type block 251N. The n-type block 253N of the first supplementary diode is conductively connected to the p-type block 252P of the second supplementary diode through a horizontal conductor 2C5 aligned with the n-type block 253N and the p-type block 252P in the fifth row. The n-type block 242N of the second supplementary diode is conductively connected to the p-type block 241P of the third supplementary diode through a horizontal conductor 2C4 aligned with the n-type block 242N and the p-type block 241P in the fourth row.

When the n-type block 251N in the fifth row is connected to the lower supply voltage VSSESD and the p-type block 243P in the fourth row is connected to an input pad (such as the input pad 52 in FIG. 2B), additional ESD protection for the input pad is provided by the supplementary diode string 280'B between the p-type block 243P and the n-type block 251N.

In FIG. 2A, the supplementary diode string 280'B (between the p-type block 243P and the n-type block 251N) and the diode string 280 (between the p-type block 243P and the n-type block 231N) shares the fourth row of the p-type blocks and the n-type blocks as a common row. The p-type block 243P is also shared by the second SCR device SCR2 in the third column and the third SCR device SCR3 in the third column. The second SCR device SCR2 is formed with the p-type block 243P, the n-type block 233N, and the n-type block 223N. The third SCR device SCR3 is formed with the p-type block 243P, the n-type block 253N, and the n-type block 263N. Because the fourth row of the p-type blocks and the n-type blocks is shared as a common row by the supplementary diode strings 280' and 280'B, layout areas for the ESD protection circuit 200 in FIG. 2A is reduced.

The third SCR device SCR3 between the p-type block 243P and the n-type block 263N is formed with a p-n-p transistor Qpnp3 and a p-n-p transistor Qpnp3, as shown in the cross-sectional view of FIG. 2D.

In FIG. 2D, each of the p-type block 243P and the p-type block 273P is implemented as heavily doped p-type regions "P+" in a corresponding n-type well "NW" of the substrate 20, and each of the n-type block 253N and the n-type block 263N is implemented as heavily doped n-type regions "N+" in corresponding n-type well "NW" of the substrate 20. The p-type block 243P is connected to an input pad (e.g., the input pad 52 in FIG. 2B), and the n-type block 263N is connected to the lower supply voltage VSSESD.

The p-n-p transistor Qpnp3 in the SCR device SCR3 has the emitter formed at the p-type block 243P, the base formed at the n-type well surrounding the p-type block 243P, and the collector formed at the substrate 20. The heavily doped n-type regions "N+" for the n-type block 263N is conductively connected to the base of the p-n-p transistor Qpnp3.

The n-p-n transistor Qnpn3 in the second SCR device SCR3 has the emitter formed at the n-type block 263N, the base formed at the substrate 20, and the collector formed at an p-type well region "PW" which is connected to the n-type block 253N. The conductive connection from the n-type block 253N to the base of the p-n-p transistor Qpnp3 is modeled with a resistor $R_{NW}$. The base of the n-p-n transistor Qnpn3 is conductively connected to the collector of the p-n-p transistor Qpnp3.

The fourth SCR device SCR4 between the p-type block 271P and the n-type block 251N is formed with a p-n-p transistor Qpnp4 and an n-p-n transistor Qnpn4, as shown in the cross-sectional view of FIG. 2C.

In FIG. 2C, each of the p-type block 271P and the p-type block 241P is implemented as heavily doped p-type regions "P+" in a corresponding n-type well "NW" of the substrate 20, and each of the n-type block 261N and the n-type block 251N is implemented as heavily doped n-type regions "N+" in a corresponding n-type well "NW" of the substrate 20. The p-type block 271P is connected to an input pad (e.g., the input pad 52 in FIG. 2A), and the n-type block 251N is connected to the lower supply voltage VSSESD.

The p-n-p transistor Qpnp4 in the fourth SCR device SCR4 has the emitter formed at the p-type block 271P, the base formed at the n-type well surrounding the p-type block 271P, and the collector formed at the substrate 20. The n-type block 261N is connected to the base of the p-n-p transistor Qpnp1. The n-type well "NW" surrounding the p-type block 271P and the n-type block 261N is connected to the upper supply voltage VDD through the heavily doped n-type region 201. The conductive connection between the base of the p-n-p transistor Qpnp4 and the upper supply voltage VDD is modeled with a resistor $R_{NW}$. The substrate 20 is connected to the lower supply voltage VSSESD through the substrate contact 209 which is a heavily doped p-type region "P+".

The n-p-n transistor Qnpn4 in the fourth SCR device SCR4 has the emitter formed at the n-type block 251N, the base formed at the substrate 20, and the collector formed at an p-type well region "PW" which is connected to the base of the p-n-p transistor Qpnp4 in the fourth SCR device SCR4. The base of the n-p-n transistor Qnpn4 is conductively connected to the collector of the p-n-p transistor Qpnp4.

In FIG. 1A and FIG. 2A, a diode string is formed with diodes D1, D2, and D3 each implemented with a p-type block and a n-type block aligned along the Y-direction in one of the columns. Specifically, the diodes D1, D2, and D3 are implemented correspondingly in the first column, the second column, and the third column. In some alternative embodiments (such as the embodiment in FIG. 3), a diode string is formed with diodes D1 and D3 implemented in a first row and with a diode D2 implemented in a second row.

Figure 3:
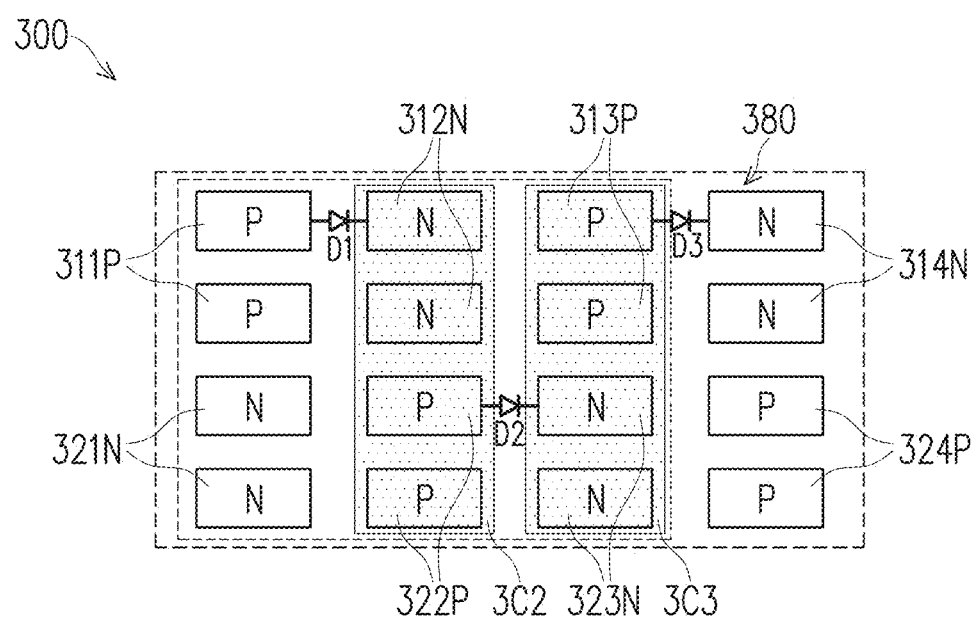
FIG. 3 is a layout diagram of a diode string in an ESD protection circuit, in accordance with some embodiments.

FIG. 3 is a layout diagram of a diode string in an ESD protection circuit, in accordance with some embodiments. In FIG. 3, the ESD protection circuit 300 includes p-type blocks and n-type blocks arranged in a matrix. The matrix includes p-type block 311P, n-type block 312N, and p-type block 313P, and n-type block 314N aligned along the X-direction in the first row. The matrix includes n-type block 321N, p-type block 322P, and n-type block 323N, and p-type block 324P aligned along the X-direction in the second row of. The p-type block 311P and the n-type block 321N are aligned along the Y-direction in the first column. The n-type block 312N and the p-type block 322P are aligned along the Y-direction in the second column. The p-type block 313P and the n-type block 323N are aligned along the Y-direction in the third column. The n-type block 314N and the p-type block 324P are aligned along the Y-direction in the third column.

A first diode D1 is formed between the p-type block 311P and the n-type block 312N. A second diode D2 is formed between the p-type block 322P and the n-type block 323P. A third diode D3 is formed between the p-type block 313P and the n-type block 314N. The n-type block 312N of the first diode D1 and the p-type block 322P of the second diode D2 are conductively connected together with a vertical conductor 3C2 extending in the Y-direction. The n-type block 323N of the second diode D2 and the p-type block 313P of the third diode D3 are conductively connected together with a vertical conductor 3C3 extending in the Y-direction. Consequently, the first diode D1, the second diode D2, and the third diode D3 are connected in series between the p-type block 311P and the n-type block 314N as a diode string 380. In some embodiments, when the p-type block 311P is connected to an input pad (e.g., the input pad 52 in FIG. 1B) and the n-type block 314N is connected to the lower supply voltage VSS, the diode string 380 formed by the diodes D1, D2, and D3 provides ESD protection for the input pad.

In the example embodiments of FIG. 1A and FIG. 2A, each of the p-type blocks is implemented with two heavily doped p-type regions, and each of the n-type blocks is implemented with two heavily doped n-type regions. In some other embodiments, a p-type block is implemented with one heavily doped p-type region. In some other embodiments, a p-type block is implemented with more than two heavily doped p-type regions. In some other embodiments, a n-type block is implemented with one heavily doped n-type region. In some other embodiments, a n-type block is implemented with more than two heavily doped n-type regions.

Figure 4C:
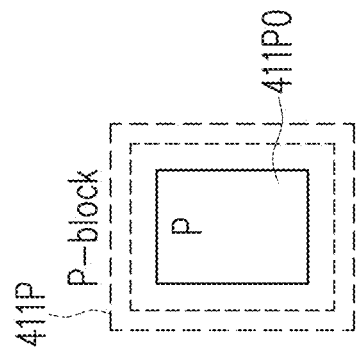
FIGS. 4A-4C are example implementations of a p-type block used in an ESD protection circuit, in accordance with some embodiments.
Figure 4B:
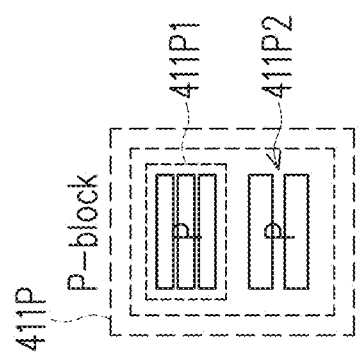
Figure 4A:
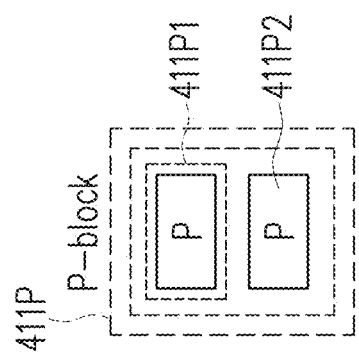

FIGS. 4A-4C are example implementations of a p-type block used in an ESD protection circuit, in accordance with some embodiments. In the example of FIG. 4A, a p-type block 411P has two heavily doped p-type regions 411P1 and 411P2. In some embodiments, each heavily doped p-type region in a p-type block is implemented with multiple fingers. For example, in FIG. 4B, the heavily doped p-type region 411P1 of the p-type block 411P has three fingers, and the heavily doped p-type region 411P2 of the p-type block 411P has two fingers. In the example of FIG. 4C, a p-type block 411P has one heavily doped p-type region 411P0. The implementations for the p-type blocks in FIGS. 4A-4C are provided as examples. Similar implementations for n-type blocks are within the contemplated scope of the present disclosure.

In the example embodiments of FIG. 1A and FIG. 2A, the combined number of the p-type blocks and the n-type blocks in each row of the matrix as shown is three. In some embodiments, the combined number of the p-type blocks and the n-type blocks in the first-row, the second-row, the third-row, the fourth-row, the fifth-row, the sixth-row, or the seventh-row is not limited to three. In some embodiments, the combined number of the p-type blocks and the n-type blocks in a row of the matrix is larger than three. For example, in some embodiments, the combined number of first-row p-type blocks and the first-row n-type blocks is larger than three, while the combined number of second-row p-type blocks and the second-row n-type blocks is also larger than three.

Figure 5:
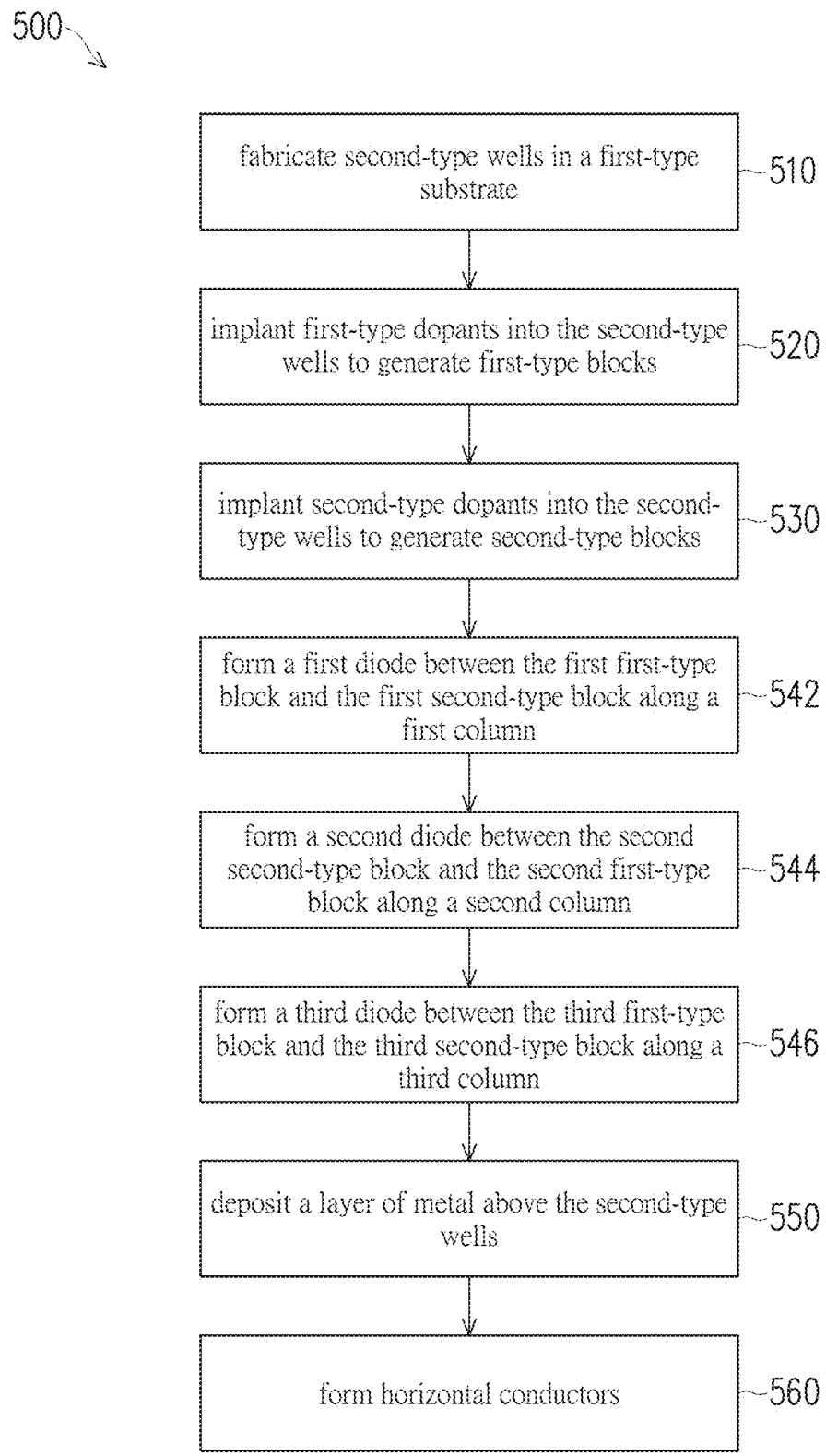
FIG. 5 is a flowchart of a method of manufacturing an integrated circuit, in accordance with some embodiments.

FIG. 5 is a flowchart of a method 500 of manufacturing an integrated circuit, in accordance with some embodiments. The sequence in which the operations of method 500 are depicted in FIG. 5 is for illustration only; the operations of method 500 are capable of being executed in sequences that differ from that depicted in FIG. 5. It is understood that additional operations may be performed before, during, and/or after the method 500 depicted in FIG. 5, and that some other processes may only be briefly described herein.

In operation 510 of method 500, second-type wells are fabricated in a first-type substrate. In the example embodiments of FIGS. 1B-1C and FIGS. 2C-2D, n-type wells "NW" are fabricated in a substrate 20.

In operation 520 of method 500, first-type dopants are implanted into the second-type wells to generate first-type blocks. In the example embodiments of FIGS. 1B-1C, p-type dopants are implanted into n-type wells "NW". Heavily doped p-type regions "P+" are generated by the p-type dopants. Because of the heavily doped p-type regions "P+", the p-type block 111P and the p-type block 113P are formed in the first row of the matrix in FIG. 1A, and the p-type block 112P is formed in the second row of the matrix in FIG. 1A.

In operation 530 of method 500, second-type dopants are implanted into the second-type wells to generate second-type blocks. In the example embodiments of FIGS. 1B-1C, p-type dopants are implanted into n-type wells "NW". Heavily doped p-type regions "N+ are generated by the n-type dopants. Because of the heavily doped n-type regions "N+", the n-type block 112N is formed in the first row of the matrix in FIG. 1A, and the n-type blocks 121N and 123N are formed in the second row of the matrix in FIG. 1A.

In operations 542, 544, and 546 of method 500, a first diode is formed between a first first-type block and a first second-type block along a first column, a second diode between the second second-type block and the second first-type block is formed along a second column, a third diode between the third first-type block and the third second-type block is formed along a third column. In the example embodiments of FIG. 1A, the first diode D1 is formed between the p-type block 111P and the n-type block 121N in the first column, the second diode D2 is formed between the n-type block 112N and the p-type block 122P in the second column, and the third diode D3 is formed between the p-type block 113P and the n-type block 123N in the first column. After operations 542, 544, and 546, the process proceeds to operations 550 and 560.

In operation 550 of method 500, a layer of metal is deposited above the second-type wells. Then, in operation 560 of method 500, horizontal conductors are formed in the layer of metal. In the example embodiments of FIGS. 1B-1C, horizontal conductors 1C1 and 12C are formed. The horizontal conductor 1C1 conductively connects the n-type block 112N with the p-type block 113P. The horizontal conductor 1C2 conductively connects the n-type block 121N with the p-type block 122P.

Figure 6:
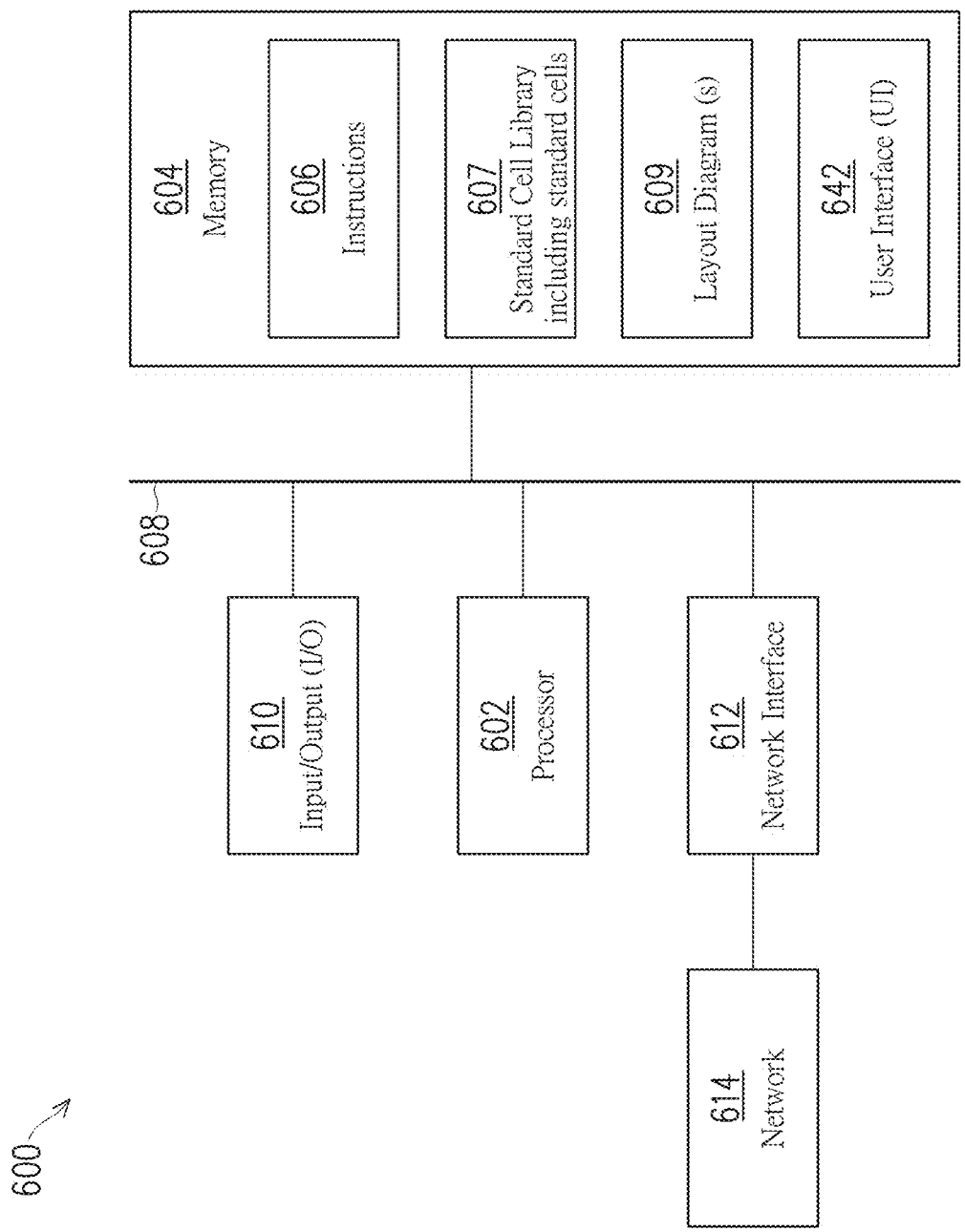
FIG. 6 is a block diagram of an electronic design automation (EDA) system 600 in accordance with some embodiments.

FIG. 6 is a block diagram of an electronic design automation (EDA) system 600 in accordance with some embodiments.

In some embodiments, EDA system 600 includes an automatic placement and routing (APR) system. Methods described herein of designing layout diagrams represent wire routing arrangements, in accordance with one or more embodiments, are implementable, for example, using EDA system 600, in accordance with some embodiments.

In some embodiments, EDA system 600 is a general purpose computing device including a hardware processor 602 and a non-transitory, computer-readable storage medium 604. Storage medium 604, amongst other things, is encoded with, i.e., stores, computer program code 606, i.e., a set of executable instructions. Execution of instructions 606 by hardware processor 602 represents (at least in part) an EDA tool which implements a portion or all of the methods described herein in accordance with one or more embodiments (hereinafter, the noted processes and/or methods).

Processor 602 is electrically coupled to computer-readable storage medium 604 via a bus 608. Processor 602 is also electrically coupled to an I/O interface 610 by bus 608. A network interface 612 is also electrically connected to processor 602 via bus 608. Network interface 612 is connected to a network 614, so that processor 602 and computer-readable storage medium 604 are capable of connecting to external elements via network 614. Processor 602 is configured to execute computer program code 606 encoded in computer-readable storage medium 604 in order to cause system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, storage medium 604 stores computer program code 606 configured to cause system 600 (where such execution represents (at least in part) the EDA tool) to be usable for performing a portion or all of the noted processes and/or methods. In one or more embodiments, storage medium 604 also stores information which facilitates performing a portion or all of the noted processes and/or methods. In one or more embodiments, storage medium 604 stores library 607 of standard cells including such standard cells as disclosed herein. In one or more embodiments, storage medium 604 stores one or more layout diagrams 609 corresponding to one or more layouts disclosed herein.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 also includes network interface 612 coupled to processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 600.

System 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. EDA system 600 is configured to receive information related to a user interface (UI) through I/O interface 610. The information is stored in computer-readable medium 604 as UI 642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 7:
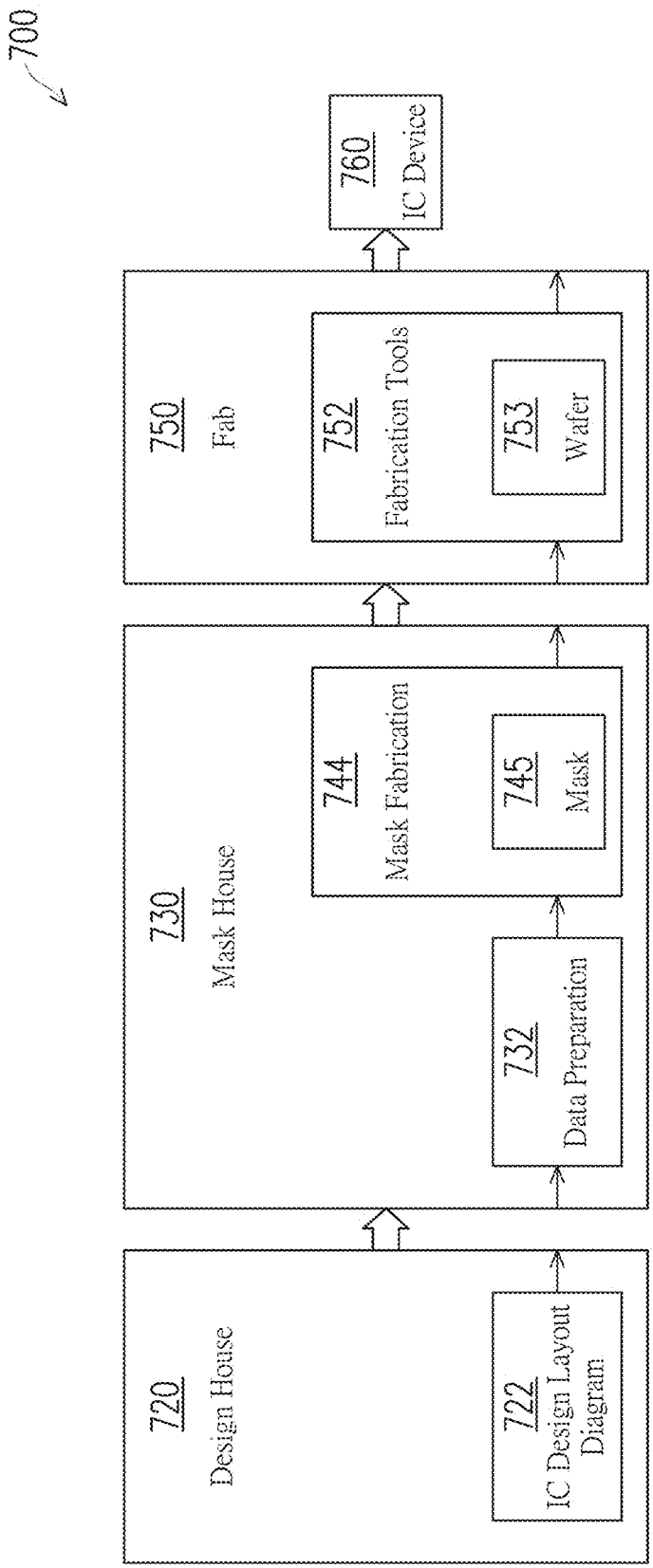
FIG. 7 is a block diagram of an integrated circuit (IC) manufacturing system 700, and an IC manufacturing flow associated therewith, in accordance with some embodiments.

FIG. 7 is a block diagram of an integrated circuit (IC) manufacturing system 700, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 700.

In FIG. 7, IC manufacturing system 700 includes entities, such as a design house 720, a mask house 730, and an IC manufacturer/fabricator (fab) 750, that interact with one another in the design, development, and manufacturing cycles and/or services related to manufacturing an IC device 760. The entities in system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and IC fab 750 is owned by a single larger company. In some embodiments, two or more of design house 720, mask house 730, and IC fab 750 coexist in a common facility and use common resources.

Design house (or design team) 720 generates an IC design layout diagram 722. IC design layout diagram 722 includes various geometrical patterns designed for an IC device 760. The geometrical patterns correspond to patterns of metal, oxide, or semiconductor layers that make up the various components of IC device 760 to be fabricated. The various layers combine to form various IC features. For example, a portion of IC design layout diagram 722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 720 implements a proper design procedure to form IC design layout diagram 722. The design procedure includes one or more of logic design, physical design or place and route. IC design layout diagram 722 is presented in one or more data files having information of the geometrical patterns. For example, IC design layout diagram 722 can be expressed in a GDSII file format or DFII file format.

Mask house 730 includes data preparation 732 and mask fabrication 744. Mask house 730 uses IC design layout diagram 722 to manufacture one or more masks 745 to be used for fabricating the various layers of IC device 760 according to IC design layout diagram 722. Mask house 730 performs mask data preparation 732, where IC design layout diagram 722 is translated into a representative data file (RDF). Mask data preparation 732 provides the RDF to mask fabrication 744. Mask fabrication 744 includes a mask writer. A mask writer converts the RDF to an image on a substrate, such as a mask (reticle) 745 or a semiconductor wafer 753. The design layout diagram 722 is manipulated by mask data preparation 732 to comply with particular characteristics of the mask writer and/or requirements of IC fab 750. In FIG. 7, mask data preparation 732 and mask fabrication 744 are illustrated as separate elements. In some embodiments, mask data preparation 732 and mask fabrication 744 can be collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts IC design layout diagram 722. In some embodiments, mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 732 includes a mask rule checker (MRC) that checks the IC design layout diagram 722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 722 to compensate for photolithographic implementation effects during mask fabrication 744, which may undo part of the modifications performed by OPC in order to meet mask creation rules.

In some embodiments, mask data preparation 732 includes lithography process checking (LPC) that simulates processing that will be implemented by IC fab 750 to fabricate IC device 760. LPC simulates this processing based on IC design layout diagram 722 to create a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 722.

It should be understood that the above description of mask data preparation 732 has been simplified for the purposes of clarity. In some embodiments, data preparation 732 includes additional features such as a logic operation (LOP) to modify the IC design layout diagram 722 according to manufacturing rules. Additionally, the processes applied to IC design layout diagram 722 during data preparation 732 may be executed in a variety of different orders.

After mask data preparation 732 and during mask fabrication 744, a mask 745 or a group of masks 745 are fabricated based on the modified IC design layout diagram 722. In some embodiments, mask fabrication 744 includes performing one or more lithographic exposures based on IC design layout diagram 722. In some embodiments, an electron-beam (e-beam) or a mechanism of multiple e-beams is used to form a pattern on a mask (photomask or reticle) 745 based on the modified IC design layout diagram 722. Mask 745 can be formed in various technologies. In some embodiments, mask 745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 745 includes a transparent substrate (e.g., fused quartz) and an opaque material (e.g., chromium) coated in the opaque regions of the binary mask. In another example, mask 745 is formed using a phase shift technology. In a phase shift mask (PSM) version of mask 745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 744 is used in a variety of processes. For example, such a mask(s) is used in an ion implantation process to form various doped regions in semiconductor wafer 753, in an etching process to form various etching regions in semiconductor wafer 753, and/or in other suitable processes.

IC fab 750 is an IC fabrication business that includes one or more manufacturing facilities for the fabrication of a variety of different IC products. In some embodiments, IC Fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 750 includes fabrication tools 752 configured to execute various manufacturing operations on semiconductor wafer 753 such that IC device 760 is fabricated in accordance with the mask(s), e.g., mask 745. In various embodiments, fabrication tools 752 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 750 uses mask(s) 745 fabricated by mask house 730 to fabricate IC device 760. Thus, IC fab 750 at least indirectly uses IC design layout diagram 722 to fabricate IC device 760. In some embodiments, semiconductor wafer 753 is fabricated by IC fab 750 using mask(s) 745 to form IC device 760. In some embodiments, the IC fabrication includes performing one or more lithographic exposures based at least indirectly on IC design layout diagram 722. Semiconductor wafer 753 includes a silicon substrate or other proper substrate having material layers formed thereon. Semiconductor wafer 753 further includes one or more of various doped regions, dielectric features, multi-level interconnects, and the like (formed at subsequent manufacturing steps).

An aspect of the present disclosure relates to an integrated circuit. The integrated circuit includes a first horizontal conductor and a second horizontal conductor each extending in a first direction. The integrated circuit includes a first diode formed between a first first-type block and a first second-type block, a second diode formed between a second first-type block and a second second-type block, and a third diode formed between a third first-type block and a third second-type block. The first first-type block and the first second-type block are aligned along a second direction that is perpendicular to the first direction. The second first-type block and the second second-type block are aligned along the second direction. The third first-type block and the third second-type block are aligned along the second direction. The second first-type block is conductively connected to the first second-type block of the first diode through the second horizontal conductor. The third first-type block is conductively connected to the second second-type block of the second diode through the first horizontal conductor.

Another aspect of the present disclosure relates to an integrated circuit. The integrated circuit includes a first-row first-type block and a first-row second-type block aligned along a first direction. The integrated circuit also includes a second-row second-type block and a second-row first-type block aligned along the first direction. The integrated circuit further includes a first diode formed between the first-row first-type block and the second-row second-type block, and a second diode formed between the second-row first-type block and the first-row second-type block. The first-row first-type block and the second-row second-type block are aligned along a second direction which is perpendicular to the first direction. The second-row first-type block and the first-row second-type block are aligned along the second direction. The integrated circuit still includes a third-row second-type block and a third-row first-type block aligned along the first direction. The third-row second-type block is adjacent to the second-row second-type block, and the third-row first-type block is adjacent to the second-row first-type block. The integrated circuit still includes a fourth-row first-type block and a fourth-row second-type block aligned along the first direction. The fourth-row first-type block is adjacent to the third-row second-type block, and the fourth-row second-type block is adjacent to the third-row first-type block.

Another aspect of the present disclosure relates to a method of manufacturing an integrated circuit. The method includes fabricating second-type wells in a first-type substrate. The method also includes implanting first-type dopants into the second-type wells to generate a first first-type block in a first row, a second first-type block in a second row, and a third first-type block in the first row. The method further includes implanting second-type dopants into the second-type wells to generate a first second-type block in the second row, a second second-type block in the first row, and a third second-type block in the second row. The first first-type block and the first second-type block are aligned along a first column and have a first diode formed therebetween. The second second-type block and the second first-type block are aligned along a second column and have a second diode formed therebetween. The third first-type block and the third second-type block are aligned along a third column and have a third diode formed therebetween. The method further still includes depositing a layer of metal above the second-type wells and the first-type substrate, forming a first horizontal conductor connecting the second second-type block with the third first-type block, and forming a second horizontal conductor connecting the first second-type block with the second first-type block.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first horizontal conductor and a second horizontal conductor each extending in a first direction;
   a first diode formed between a first first-type block and a first second-type block which are aligned along a second direction that is perpendicular to the first direction;
   a second diode formed between a second first-type block and a second second-type block which are aligned along the second direction, wherein the second first-type block is conductively connected to the first second-type block of the first diode through the second horizontal conductor; and
   a third diode formed between a third first-type block and a third second-type block which are aligned along the second direction, wherein the third first-type block is conductively connected to the second second-type block of the second diode through the first horizontal conductor.

2. The integrated circuit of claim 1, wherein a first-type block comprises one or more heavily doped p-type region, and a second-type block comprises one or more heavily doped n-type region.

3. The integrated circuit of claim 1, wherein a first-type block comprises one or more heavily doped n-type region, and a second-type block comprises one or more heavily doped p-type region.

4. The integrated circuit of claim 1, wherein the first first-type block, the second second-type block and the third first-type block are aligned along the first direction, and wherein the first second-type block, the second first-type block and the third second-type block are aligned along the first direction.

5. The integrated circuit of claim 1, further comprising:
   a third horizontal conductor and a fourth horizontal conductor each extending in the first direction;
   a fourth diode formed between a fourth first-type block and a fourth second-type block which are aligned along the second direction;
   a fifth diode formed between a fifth first-type block and a fifth second-type block which are aligned along the second direction, wherein the fifth first-type block is conductively connected to the fourth second-type block of the fourth diode through the third horizontal conductor; and
   a sixth diode formed between a sixth first-type block and a sixth second-type block which are aligned along the second direction, wherein the sixth first-type block is conductively connected to the fifth second-type block of the fifth diode through the fourth horizontal conductor.

6. The integrated circuit of claim 5, wherein the fourth first-type block, the fifth second-type block, and the sixth first-type block are aligned along the first direction, and wherein the fourth second-type block, the fifth first-type block, and the sixth second-type block are aligned along the first direction.

7. The integrated circuit of claim 5, wherein the fourth second-type block is adjacent to the third second-type block, the fifth first-type block is adjacent to the second first-type block, and the sixth second-type block is adjacent to the first second-type block.

8. The integrated circuit of claim 5, wherein the first first-type block, the first second-type block, and the sixth second-type block is aligned along the second direction and forms a first silicon controlled rectifier, and wherein the fourth first-type block, the fourth second-type block, and the third second-type block is aligned along the second direction and forms a second silicon controlled rectifier.

9. The integrated circuit of claim 1, further comprising:
a third horizontal conductor and a fourth horizontal conductor each extending in the first direction;
a fourth diode formed between a fourth first-type block and a fourth second-type block which are aligned along the second direction;
a fifth diode formed between a fifth first-type block and a fifth second-type block which are aligned along the second direction, wherein the fifth first-type block is conductively connected to the fourth second-type block of the fourth diode through the third horizontal conductor; and
a sixth diode formed between a sixth first-type block and a sixth second-type block which are aligned along the second direction, wherein the sixth first-type block is conductively connected to the fifth second-type block of the fifth diode through the third horizontal conductor; and
wherein the fourth first-type block is adjacent to the first second-type block, the fifth second-type block is adjacent to the second first-type block, and the sixth first-type block is adjacent to the third second-type block.

10. The integrated circuit of claim 9, wherein the fourth first-type block, the fifth second-type block, and the sixth first-type block are aligned along the first direction, and wherein the fourth second-type block, the fifth first-type block, and the sixth second-type block are aligned along the first direction.

11. An integrated circuit comprising:
a first-row first-type block and a first-row second-type block aligned along a first direction;
a second-row second-type block and a second-row first-type block aligned along the first direction;
a first diode formed between the first-row first-type block and the second-row second-type block, wherein the first-row first-type block and the second-row second-type block are aligned along a second direction which is perpendicular to the first direction;
a second diode formed between the second-row first-type block and the first-row second-type block, wherein the second-row first-type block and the first-row second-type block are aligned along the second direction;
a third-row second-type block and a third-row first-type block aligned along the first direction, wherein the third-row second-type block is adjacent to the second-row second-type block, and wherein the third-row first-type block is adjacent to the second-row first-type block; and
a fourth-row first-type block and a fourth-row second-type block aligned along the first direction, wherein the fourth-row first-type block is adjacent to the third-row second-type block, and wherein the fourth-row second-type block is adjacent to the third-row first-type block.

12. The integrated circuit of claim 11, wherein the fourth-row first-type block, the third-row second-type block, the second-row second-type block, and the first-row first-type block are aligned along the second direction in a column of a matrix, and wherein the fourth-row second-type block, the third-row first-type block, the second-row first-type block, and the first-row second-type block are aligned along the second direction in another column of the matrix.

13. The integrated circuit of claim 11, further comprising:
an input pad conductively connected to the first-row first-type block, wherein the first-row first-type block, the second-row second-type block, and the third-row second-type block forms a first silicon controlled rectifier along a first column of a matrix.

14. The integrated circuit of claim 13, wherein the third-row second-type block in the first column is configured to be connected to a supply voltage.

15. The integrated circuit of claim 13, further comprising:
a horizontal conductor extending in the first direction and conductively connecting the second-row second-type block of the first diode with the second-row first-type block of the second diode.

16. The integrated circuit of claim 11, further comprising:
an input pad conductively connected to the fourth-row first-type block, wherein the fourth-row first-type block, the third-row second-type block, the second-row second-type block forms second a second silicon controlled rectifier along a third column of a matrix.

17. The integrated circuit of claim 16, wherein the second-row second-type block in the third column is configured to be connected to at a supply voltage.

18. The integrated circuit of claim 16, further comprising:
a horizontal conductor extending in the first direction and conductively connecting the first-row second-type block of the first diode with the first-row first-type block of the second diode.

19. A method of manufacturing an integrated circuit comprising:
fabricating second-type wells in a first-type substrate;
implanting first-type dopants into the second-type wells to generate a first first-type block in a first row, a second first-type block in a second row, and a third first-type block in the first row;
implanting second-type dopants into the second-type wells to generate a first second-type block in the second row, a second second-type block in the first row, and a third second-type block in the second row;
forming a first diode between the first first-type block and the first second-type block along a first column, forming a second diode between the second second-type block and the second first-type block along a second column, and forming a third diode between the third first-type block and the third second-type block along a third column;
depositing a layer of metal above the second-type wells and the first-type substrate; and
forming a first horizontal conductor connecting the second second-type block with the third first-type block and forming a second horizontal conductor connecting the first second-type block with the second first-type block.

20. The method of claim 19, further comprising:
connecting the first first-type block to an input pad of the integrated circuit.

* * * * *